(12) United States Patent
Cheng et al.

(10) Patent No.: US 9,293,373 B1
(45) Date of Patent: Mar. 22, 2016

(54) METHOD FOR FABRICATING CMOS FINFETS WITH DUAL CHANNEL MATERIAL

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/721,574

(22) Filed: May 26, 2015

(51) Int. Cl.
| | |
|---|---|
| *H01L 21/00* | (2006.01) |
| *H01L 21/84* | (2006.01) |
| *H01L 21/20* | (2006.01) |
| *H01L 21/36* | (2006.01) |
| *H01L 21/8234* | (2006.01) |
| *H01L 21/02* | (2006.01) |
| *H01L 29/66* | (2006.01) |
| *H01L 27/092* | (2006.01) |

(52) U.S. Cl.
CPC .. *H01L 21/823412* (2013.01); *H01L 21/02532* (2013.01); *H01L 21/823431* (2013.01); *H01L 27/0924* (2013.01); *H01L 29/66795* (2013.01); *H01L 29/66818* (2013.01)

(58) Field of Classification Search
CPC .......... H01L 21/823412; H01L 21/02532; H01L 27/0924; H01L 29/66795

USPC ................................. 438/154, 479
See application file for complete search history.

(56) References Cited

U.S. PATENT DOCUMENTS

| | | | |
|---|---|---|---|
| 7,622,341 B2 | 11/2009 | Chudzik et al. | |
| 7,915,112 B2 | 3/2011 | Xu et al. | |
| 8,580,659 B2 | 11/2013 | Zhang et al. | |
| 2014/0027860 A1 | 1/2014 | Glass et al. | |
| 2014/0030876 A1 | 1/2014 | Flachowsky et al. | |
| 2014/0252483 A1 | 9/2014 | Nagumo | |
| 2014/0308781 A1 | 10/2014 | Basker et al. | |
| 2014/0353767 A1* | 12/2014 | Liu ..................... | H01L 21/845 257/401 |
| 2014/0357060 A1 | 12/2014 | Liu et al. | |

* cited by examiner

*Primary Examiner* — David S Blum
(74) *Attorney, Agent, or Firm* — Scully, Scott, Murphy & Presser, P.C.; Steven J. Meyers

(57) ABSTRACT

A method of forming dual channel FinFETs is provided. Spaced apart first semiconductor material fins are provided in first and second device regions. A second semiconductor material fin having a lattice constant that differs from the first semiconductor material is formed in a gap located between each first semiconductor material fin and in the first and second device regions. A sacrificial structure is formed on each of the semiconductor material fins and in the first and second device regions. The sacrificial structure and each second semiconductor material fin are selectively removed from the first device region to provide a first gate cavity. A first gate structure is formed in the first gate cavity. The sacrificial structure and each first semiconductor material fin are selectively removed from the second device region to provide a second gate cavity. A second gate structure is formed in the second gate cavity.

20 Claims, 5 Drawing Sheets

US 9,293,373 B1

METHOD FOR FABRICATING CMOS FINFETS WITH DUAL CHANNEL MATERIAL

BACKGROUND

The present application relates to a method of forming a semiconductor structure. More particularly, the present application relates to a method of forming dual channel complementary metal oxide semiconductor (CMOS) fin field effect transistors (i.e., finFETs).

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, semiconductor fin field effect transistors (FinFETs) is the next step in the evolution of complementary metal oxide semiconductor (CMOS) devices. Semiconductor fin field effect transistors (FETs) can achieve higher drive currents with increasingly smaller dimensions as compared to conventional planar FETs. In order to extend these devices for multiple technology nodes, there is a need to boost the performance with high-mobility channels.

Dual channel CMOS having different channel materials is needed for 10 nm and beyond technologies. For example, Si fins are needed for nFinFET devices, while SiGe fins are needed for pFinFET devices. Due to the material property difference however processing semiconductor fins having different channel mobility still has some unique challenges. For example, SiGe and Si have different etch rates.

In view of the above, there is a need to provide a method for forming dual channel CMOS FinFETs within minimal process deviation from conventional CMOS fabrication.

SUMMARY

A method for forming dual channel CMOS FinFETs within minimal process deviation from conventional CMOS fabrication is provided. The method of the present application includes providing a plurality of spaced apart first semiconductor material fins in a first device region and a second device, wherein each first semiconductor material fin comprises a first semiconductor material and extends upward from a substrate. A second semiconductor material fin is formed in a gap located between each first semiconductor material fin within the first device region and within the second device region, wherein each second semiconductor material fin comprises a second semiconductor material having a lattice constant that differs from the first semiconductor material. A first sacrificial structure is then formed over the first device region and a second sacrificial structure is formed over the second device region.

In one embodiment of the present application, the method continues by selectively removing the first sacrificial structure and each second semiconductor material fin from the first device region to provide a first gate cavity. A first functional gate structure is then formed in the first gate cavity and straddling each first semiconductor material fin. Next, the second sacrificial structure and each first semiconductor material fin are selectively removed from the second device region to provide a second gate cavity. A second functional gate structure is then formed in the second gate cavity and straddling each second semiconductor material fin.

In another embodiment of the present application, the method continues by selectively removing the second sacrificial structure and each first semiconductor material fin from the second device region to provide a second gate cavity. A second functional gate structure is then formed in the second gate cavity and straddling each second semiconductor material fin. Next, the first sacrificial structure and each first semiconductor material fin are selectively removed from the second device region to provide a first gate cavity. A first functional gate structure is then formed in the first gate cavity and straddling each first semiconductor material fin.

DETAILED DESCRIPTION

Figure 1:
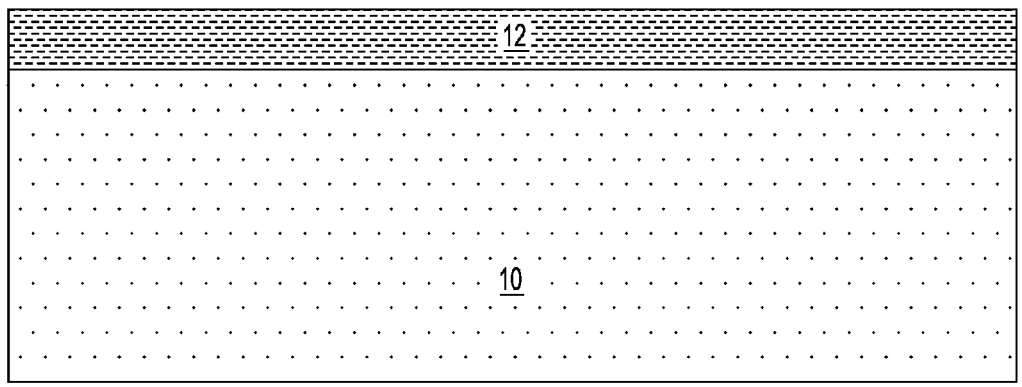
FIG. 1 is a cross sectional view of an exemplary semiconductor structure including, from bottom to top, a first semiconductor material having a first lattice constant, and a hard mask layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring first to FIG. 1, there is illustrated an exemplary semiconductor structure including, from bottom to top, a first semiconductor material 10 having a first lattice constant, and a hard mask layer 12 that can be employed in accordance with an embodiment of the present application. As is shown, the hard mask layer 12 that is formed is a contiguous layer that covers an entirety of the underlying first semiconductor material 10.

In one embodiment of the present application, the first semiconductor material 10 may comprise an uppermost portion of a bulk semiconductor substrate. In another embodiment, the first semiconductor material 10 comprises an entirety of a bulk semiconductor substrate. By "bulk semiconductor substrate" it is meant that the entirety of the semiconductor substrate comprises one or more semiconductor materials.

The first semiconductor material 10 that can be employed in the present application may include any semiconductor material including, for example, Si, Ge, SiGe, SiC, SiGeC, a II/VI compound semiconductor or a III/V compound semiconductor such as, for example, InAs, GaAs, or InP. In one embodiment, the first semiconductor material 10 may comprise Si. The first semiconductor material 10 is typically a single crystalline semiconductor such as, for example, single crystal silicon. In some embodiments, the first semiconductor material 10 may have any of the well known crystal orientations. For example, the first semiconductor material 10 may have {100}, {110}, or {111} crystal orientation.

In one embodiment of the present application, the thickness of the first semiconductor material 10 that can be used in the present application can be from 300 mm to 875 µm. Other thicknesses that are lesser than, or greater than, the aforementioned range can also be employed in the present application as the thickness of the first semiconductor material 10.

The hard mask layer 12 comprises at least one hard mask material. The hard mask material that can be employed in the present application as hard mask layer 12 may include a semiconductor oxide, a semiconductor nitride and/or a semiconductor oxynitride. In one embodiment, the hard mask material that can be used in the present application as the hard mask layer 12 may be comprised of silicon dioxide. In another embodiment, the hard mask material that can be used in the present application as the hard mask layer 12 may be comprised of silicon nitride. In yet another embodiment, the hard mask material that can be used in the present application as the hard mask layer 12 may include a hard mask stack of, in any order, silicon dioxide and silicon nitride.

In some embodiments, the hard mask material that can be used in the present application as the hard mask layer 12 can be formed by a deposition process such as, for example, chemical vapor deposition (CVD) or plasma enhanced chemical vapor deposition (PECVD). In other embodiments, the hard mask material that can be used in the present application as the hard mask layer 12 may be formed by a thermal process such as, for example, thermal oxidation and/or thermal nitridation. In yet other embodiments, the hard mask material that can be used in the present application as the hard mask layer 12 may be formed by a combination of a deposition process and a thermal process. The thickness of the hard mask material that can be used in the present application as the hard mask layer 12 may range from 5 nm to 20 nm. Other thicknesses that are lesser than, or greater than, the aforementioned thickness range may also be used as the thickness of hard mask layer 12.

Figure 2:
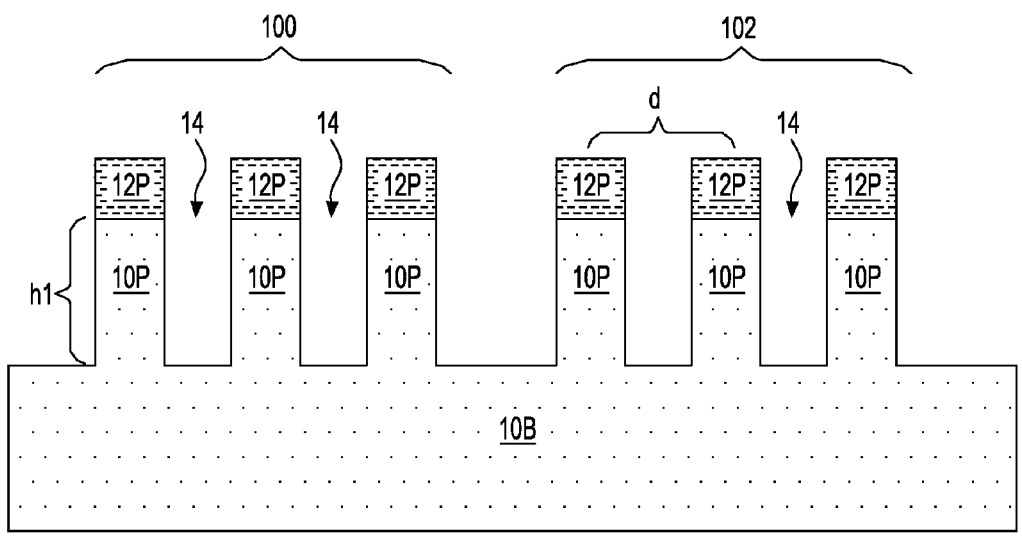
FIG. 2 is a cross sectional view of the exemplary semiconductor structure of FIG. 1 after forming a plurality of first semiconductor material fins extending upwards from a remaining portion of the first semiconductor material and in a first device region and a second device region.

Referring now to FIG. 2, there is illustrated the exemplary semiconductor structure of FIG. 1 after forming a plurality of first semiconductor material fins 10P extending upwards from a remaining portion of the first semiconductor material and in a first device region 100 and a second device region 102. The remaining portion of the first semiconductor material after first semiconductor material fin 10P definition may be referred to herein as a first semiconductor material portion 10B. In such an embodiment, the first semiconductor material portion 10B provides a substrate of the exemplary semiconductor structure of the present application. In other embodiments, and when a multilayered bulk semiconductor substrate is used, an underlying semiconductor material or materials of such a multilayered bulk semiconductor may provide a substrate of the exemplary semiconductor structure of the present application. Each remaining portions of the hard mask layer 12 may be referred to herein as hard mask portion 12P.

The first device region 100 is a region of the exemplary semiconductor structure in which a first conductivity-type FET will be subsequently formed, while the second device region 102 is a region of the exemplary semiconductor structure in which a second conductivity-type FET, which is opposite to the first conductivity FET, is formed. In one embodiment, the first device region 100 is an n-FET device region, while the second device region 102 is a p-FET device region. In another embodiment, the first device region 100 is a p-FET device region, while the second device region 102 is an n-FET device region.

The first semiconductor material fins 10P can be formed utilizing a patterning process. In one embodiment of the present application, the patterning process comprises a sidewall image transfer (SIT) process. The SIT process includes forming a contiguous mandrel material layer (not shown) on the hard mask layer 12. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers entirely through the hard mask layer 12 and into at least a portion of the underlying first semiconductor material 10. The pattern transfer may be achieved by utilizing at least one etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process. First semiconductor material fins 10P that are formed outside of the first and second device regions (100, 102) can be removed to provide the structure shown in FIG. 2.

In another embodiment, the patterning process can include lithography and etching. Lithography includes forming a photoresist material (not shown) on the hard mask layer 12. The photoresist material can be formed utilizing a deposition process such as, for example, spin-on coating, evaporation, or chemical vapor deposition. Following the deposition of the photoresist material, the photoresist material is exposed to a pattern of irradiation, and thereafter the exposed resist material is developed utilizing a conventional resist developer to provide a patterned photoresist material. At least one etch as mentioned above for the SIT process can be used here to complete the pattern transfer. Following at least one pattern transfer etch process, the patterned photoresist material can be removed from the structure utilizing a conventional resist stripping process such as, for example, ashing. First semiconductor material fins 10P that are formed outside of the first and second device regions (100, 102) can be removed to provide the structure shown in FIG. 2.

Each first semiconductor material fin 10P that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each first semiconductor material fin 10P that is formed has height, h1, from 10 nm to 100 nm. In some embodiments, the width of each first semiconductor material fin 10P that is formed is about half the desired fin pitch. The term "fin pitch" is used throughout the present application to denote a distance, d, between a central portion of one semiconductor material fin to a neighboring semiconductor material fin that is present in a given device region. In one embodiment, the pitch can be from 12 nm to 40 nm. The width of each first semiconductor material fin 10P can be from 6 nm to 20 nm. Other heights and widths that are lesser than, or greater than, the aforementioned ranges may also be used in the present application for each first semiconductor material fin 10P. Each neighboring pair of first semiconductor material fins 10P that is formed in a given device region (100, 102) is separated by a gap 14, whose width is substantially equal to the width of each first semiconductor material fin portion 10P. By "substantially equal" it is meant ±0.5 nm.

Figure 3:
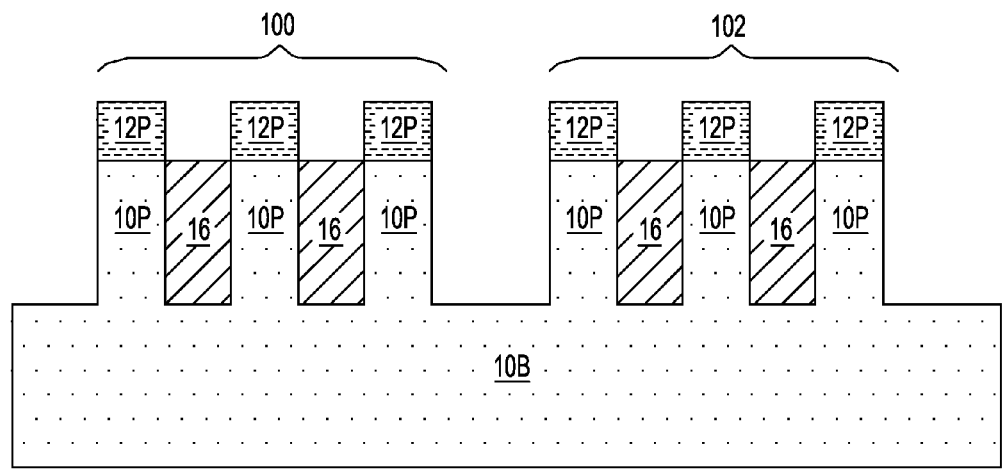
FIG. 3 is a cross sectional view of the exemplary semiconductor structure of FIG. 2 after providing a plurality of second semiconductor material fins having a second lattice constant that is different from the first lattice constant of the first semiconductor material within the first and second device regions.

Referring now to FIG. 3, there is illustrated the exemplary semiconductor structure of FIG. 2 after providing a plurality of second semiconductor material fins 16 having a second lattice constant that is different from the first lattice constant of the first semiconductor material 10 (and hence each first semiconductor material fin 10P) within the first and second device regions (100, 102). In the illustrated embodiment, each second semiconductor material fin 16 within the first and second device regions (100, 102) is located between a pair of first semiconductor material fins 10P. That is, each second semiconductor material fin 16 is present in the gap 14 between, and in direct contact with, a neighboring pair of first semiconductor material fins 10P in the first and second device regions (100, 102). In accordance with an embodiment of the present application, the second lattice constant of the second semiconductor material fin 16 is within 1 percent of the first lattice constant of the first semiconductor material 10.

Each second semiconductor material fin 16 that is formed in the present application comprises a second semiconductor material that differs from the first semiconductor material 10 that was used in providing each first semiconductor material fin 10P. For example and in one embodiment of the present application, each first semiconductor material fin 10P may comprise Si, while each second semiconductor material fin 16 may comprise a silicon germanium alloy, i.e., SiGe.

The second semiconductor material that can be used in providing each second semiconductor material fin 16 can be formed utilizing an epitaxial growth (or epitaxial deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In the present application, second semiconductor material that provides each second semiconductor material fin 16 has an epitaxial relationship, i.e., same crystal orientation, as that of the first semiconductor material 10.

Examples of various epitaxial growth processes that are suitable for use in forming the second semiconductor material include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 900° C. Although higher temperature typically results in faster deposition, the faster deposition may result in crystal defects and film cracking.

A number of different source gases may be used for the deposition of second semiconductor material. In some embodiments, the source gas for the deposition of the silicon germanium alloy material includes a mixture of a silicon containing gas source and a germanium containing gas source or a combined silicon and germanium source gas may be used. Carrier gases like hydrogen, nitrogen, helium and argon can be used.

It is noted that the second semiconductor material is epitaxially grown across the entire substrate (i.e., across the remaining portions of the first semiconductor material 10B and within the first and second device regions (100, 102)) and thereafter it is selectively removed from those areas that are outside the first and second device regions (100, 102) utilizing techniques well known to those skilled in the art so as to provide the exemplary semiconductor structure shown in FIG. 3.

Each second semiconductor material fin 16 that is formed has a height that is equal to the height of each first semiconductor material fin 10P. The width of each second semiconductor material fin 16 is substantially equal to the width of each first semiconductor material fin 10P.

Figure 4:
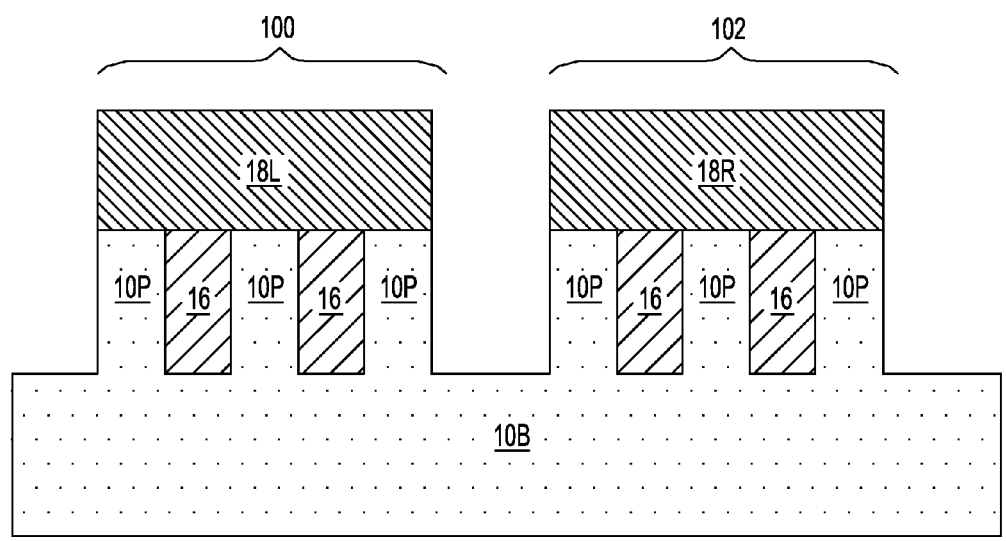
FIG. 4 is a cross sectional view of the exemplary semiconductor structure of FIG. 3 after removing the remaining portions of the hard mask layer and forming a sacrificial structure in each of the first and second device regions.

Referring now to FIG. 4, there is illustrated the exemplary semiconductor structure of FIG. 3 after removing the remaining portions of the hard mask layer (i.e., each hard mask portion 12P) and forming a sacrificial structure 18L, 18R in each device region (i.e., the first device region 100 and the second device region 102). Sacrificial structure 18L may be referred to herein as a first sacrificial structure, while sacrificial structure 18R may be referred to herein as a second sacrificial structure. In one embodiment of the present application, the removal of each hard mask portion 12P may be performed utilizing a planarization process such as, for example, chemical mechanical polishing and/or grinding. In another embodiment, an etch process that selectively removes the hard mask material can be used to remove each hard mask portion 12P.

After removal of each hard mask portion 12P, a sacrificial structure 18L, 18R can be formed in each of the first and second device regions (100, 102). Sacrificial structure 18L covers a portion of each first semiconductor material fin 10P and a portion of each second semiconductor material fin 16 in the first device region 100, while sacrificial structure 18R covers a portion of each first semiconductor material fin 10P and a portion of each second semiconductor material fin 16 in the second device region 102. Other portions of each first semiconductor material fin 10P and other portions of each second semiconductor material fin 16 in the first device region 100 and second device region 102 are not covered by the sacrificial structure. The non-protected portions of each first semiconductor material fin 10P and each second semiconductor material fin 16 would run into and out of the plane of the drawing sheet including FIG. 4. As known to those skilled in the art, the non-protected portions of each first semiconductor material fin 10P and each second semiconductor material fin 16 are in the source/drain regions of the exemplary semiconductor structure of the present application. In some embodiments (not shown), the first sacrificial structure 18L and/or second sacrificial structure 18R may have a portion that covers sidewall surfaces of the outermost first semiconductor material fins 10P.

Each sacrificial structure 18L, 18R thus protects a gate region of the exemplary semiconductor structure of the present application during the processing of the source/drain regions of the exemplary semiconductor structure. Although a single sacrificial structure 18L, 18R is described and illustrated in each device region (100, 102), a plurality of sacrificial structures can be formed on different portions of each first semiconductor material fin 10P and each second semiconductor material fin 16 in the first and second device regions (100, 102).

Each sacrificial structure 18L, 18R includes a single sacrificial material layer or a stack of two or more sacrificial materials (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation, may be used.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material is formed. The sacrificial gate cap material may include one of the materials mentioned above for the hard mask layer. The sacrificial gate cap material can be formed utilizing one of the techniques mentioned above for forming the hard mask layer.

After providing the above mentioned sacrificial material stack (or any subset of said sacrificial materials), lithography and etching can be used to pattern the sacrificial material stack (or any subset of said sacrificial materials) and to provide each sacrificial structure 18L, 18R. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

At this point of the present application, a dielectric spacer (not shown) can be formed on exposed sidewall surfaces of the each sacrificial structure 18L, 18R. The dielectric spacer can be formed by first providing a dielectric spacer material and then etching the dielectric spacer material. Examples of dielectric spacer materials that may be employed in the present application include dielectric oxides, dielectric nitrides and/or dielectric oxynitrides. In one embodiment, the dielectric spacer material used in providing each dielectric spacer is composed of silicon dioxide or silicon nitride. The dielectric spacer material may be provided by a deposition process including, for example, chemical vapor deposition (CVD), plasma enhanced chemical vapor deposition (PECVD), or physical vapor deposition (PVP). The etch used to provide the dielectric spacer may comprise a dry etching process such as, for example, reactive ion etching.

It is noted that source/drain structures (not shown) now can be formed on the exposed surfaces of each first semiconductor material fin 10P in the first device region 100 and/or each second semiconductor material fin 16 in the second device region 102 after formation of the sacrificial structures 18L, 18R. In some embodiments, an etch may be employed to remove any unwanted first semiconductor material or second semiconductor material from the source/drain regions and in each device region (100, 102). As mentioned above, the source/drain regions and thus the source/drain structures would be located within a plane that runs into and out of the drawing sheet. The semiconductor material that provides each source/drain structure may be one of the semiconductor materials mentioned above. For example, silicon or a silicon germanium alloy can be used as a semiconductor material for the source/drain structures. The source/drain structures further include an n-type or a p-type dopant. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon containing substrate, examples of n-type dopants, i.e., impurities, include, but are not limited to, antimony, arsenic and phosphorous. The concentration of dopants within semiconductor material that provides the source/drain structure can be within ranges typically used in forming metal oxide semiconductor field effect transistors (MOSFETs).

The semiconductor material that provides the source/drain structures can be formed utilizing an epitaxial deposition process such as that mentioned previously herein. The dopant can be introduced into the semiconductor material that provides the source/drain structures during the growth of the semiconductor material, or after growth of an intrinsic semiconductor utilizing gas phase doping.

Figure 5:
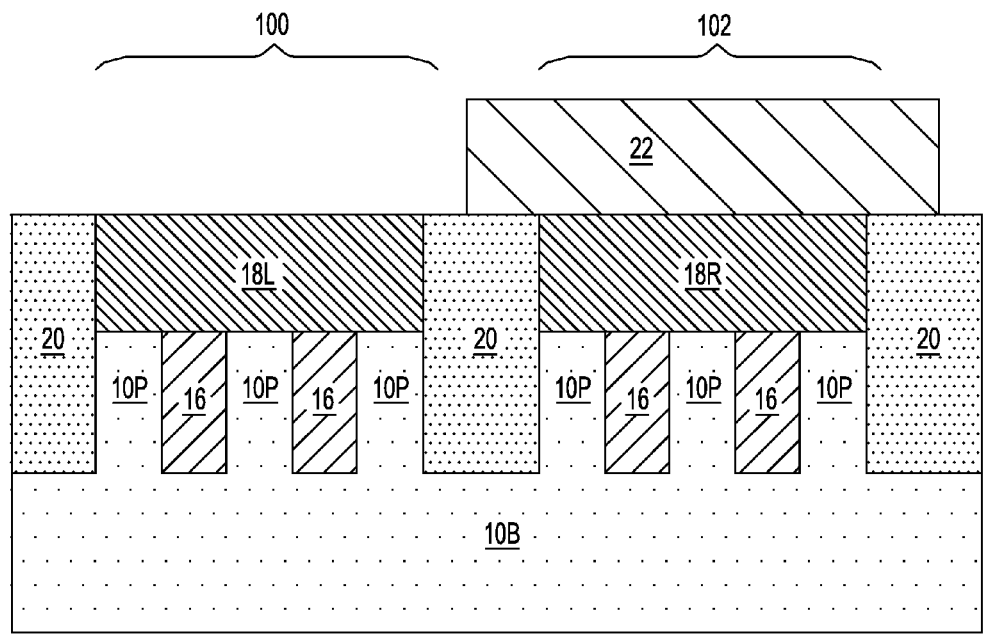
FIG. 5 is a cross sectional view of the exemplary semiconductor structure of FIG. 4 after forming an interlevel dielectric material, and forming a block mask over a second device region, while leaving a first device region exposed.

Referring now to FIG. 5, there is illustrated the exemplary semiconductor structure of FIG. 4 after forming an interlevel dielectric (ILD) material 20, and forming a block mask 22 over a second device region 102, while leaving a first device region 100 exposed. Although the present application describes and illustrates first forming the block mask 22 over the second device region 102, and then processing the first device region 100 prior to processing the second device region 102, the present application also contemplates an embodiment in which a block mask is first provided over the first device region 100, and then processing the second device region 102 prior to processing the first device region 100. As is shown, the ILD material 20 has a topmost surface that is coplanar with a topmost surface of each sacrificial structure 18L, 18R.

In some embodiments, the ILD material 20 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the ILD material 20. The use of a self-planarizing dielectric material as ILD material 20 may avoid the need to perform a subsequent planarizing step.

In one embodiment, the ILD material 20 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 20, a planarization process or an etch back process follows the deposition of the ILD material 20. The thickness of the ILD material 20 that can be employed in the present application may vary depending on the type of dielectric material employed as well as the method that was employed in forming the same. In one embodiment, the ILD material 20 has a thickness from 80 nm to 500 nm. Other thicknesses that are greater or lesser than the range provided above can also be used for the ILD material 20.

After providing the ILD material 20, and in the illustrated embodiment, block mask 22 is formed over the second device region 102. Block mask 22 can be comprised of block mask material that has a different etch rate than the topmost sacrificial material that provides the sacrificial structure 18L, 18R, and the ILD material 20. Illustrative examples of block mask materials that can be used in the present application in providing block mask 22 include one of the hard mask materials mentioned above for hard mask layer 12, a photoresist material or a material stack of a hard mask material and a photoresist material. In some embodiments, amorphous carbon can be used as the block mask material. The block mask 22 can be formed by depositing a block mask material, and thereafter patterning the block mask material. The deposition of the block mask material may include chemical vapor deposition (CVD), plasma enhanced chemical vapor deposition (PECVD), spin-on coating, evaporation or chemical solution deposition. The patterning of the block mask may be performed by lithography alone, or lithography and etching may be used.

Figure 6:
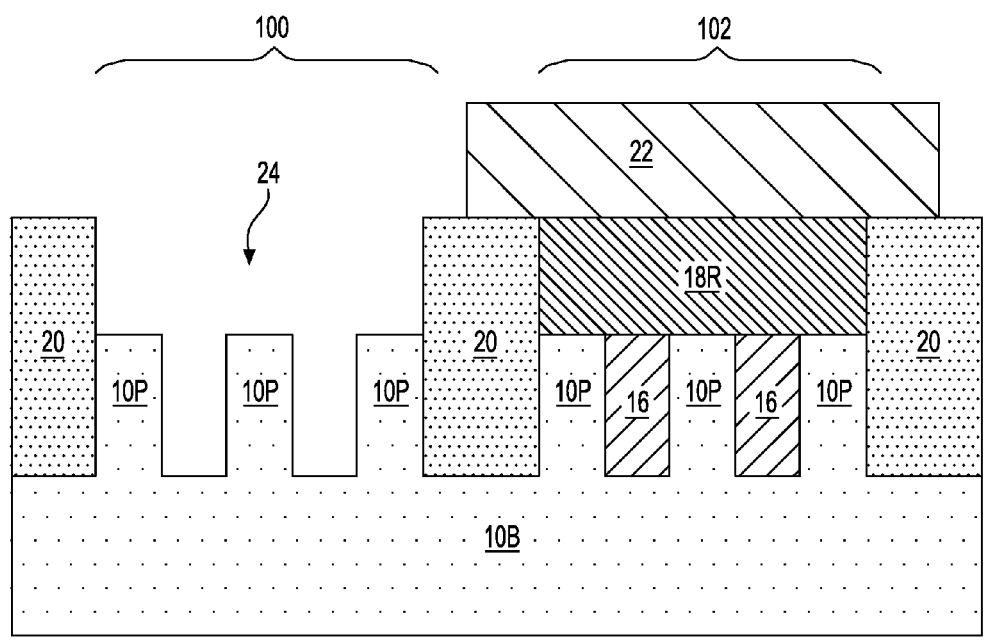
FIG. 6 is a cross sectional view of the exemplary semiconductor structure of FIG. 5 after removing the sacrificial structure and each second semiconductor material fin from the first device region.

Referring now to FIG. 6, there is illustrated the exemplary semiconductor structure of FIG. 5 after removing sacrificial structure 18L and each second semiconductor material fin 16 from first device region 100. The removal of sacrificial structure 18L and each second semiconductor material fin 16 from first device region 100 forms a first gate cavity 24.

The removal of sacrificial structure 18L comprises an etching process that is selective in removing the sacrificial material (or materials) that provide sacrificial structure 18L. In one example, a reactive ion etch can be used to remove the sacrificial structure 18L.

After removing sacrificial structure 18L from the first device region 100, each second semiconductor material fin 16 is removed utilizing an etching process that is selective in removing the second semiconductor material that provides each second semiconductor material fin 16 relative to the semiconductor material that provides each first semiconductor material fin 10P. In one example, and when each second semiconductor material fin 16 comprises a silicon germanium alloy, and each first semiconductor material fin 10P comprises silicon, a gaseous HCl etch can be used to selectively remove each second semiconductor material fin 16 from the first device region 100.

Figure 7:
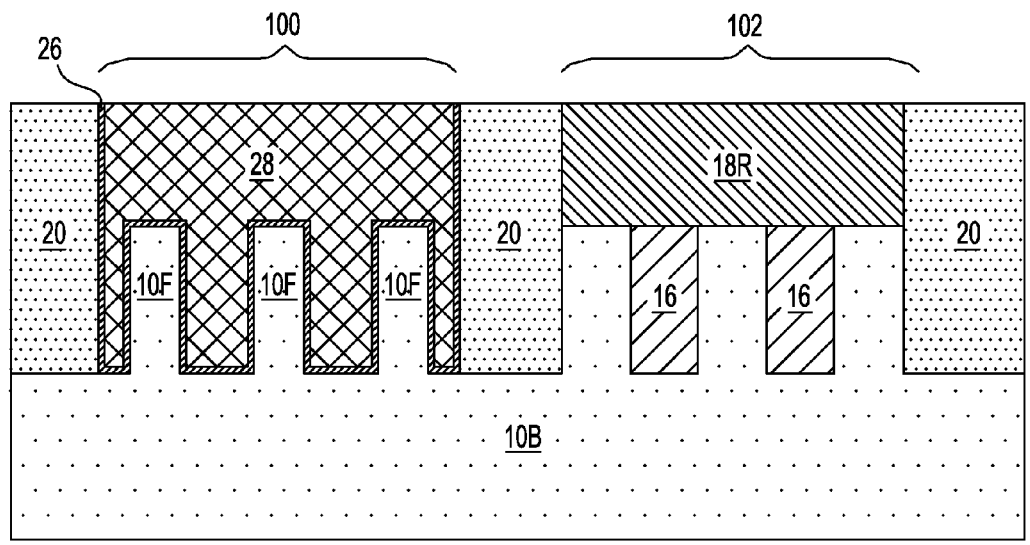
FIG. 7 is a cross sectional view of the exemplary semiconductor structure of FIG. 6 after thinning each of the first semiconductor material fins within the first device region, forming a first functional gate structure straddling each thinned first semiconductor material fin within the first device region, and removing the block mask from over the second device region.

Referring now to FIG. 7, there is illustrated the exemplary semiconductor structure of FIG. 6 after thinning each of the first semiconductor material fins 10P within the first device region 100, forming a first functional gate structure (26, 28) straddling each thinned first semiconductor material fin within the first device region 100, and removing block mask 22. The first functional gate structure (26, 28) is formed within the first gate cavity 24 mentioned above.

The thinned first semiconductor material fins 10P that can be formed have a width that is less than the width of each first semiconductor material fin 10P within the first device region 100 prior to performing the thinning. In some embodiments, the thinning of the first semiconductor material fins 10P within the first device region 100 can be omitted and the first semiconductor material fins 10P shown in FIG. 6 can be processed to include a first functional gate structure. Each thinned first semiconductor material fin within the first device region 100 that can be optionally formed can be referred to herein as first semiconductor material fin portion 10F.

In one embodiment of the present application, thinning of the first semiconductor material fin 10P within the first device region 100 may include thermal oxidation followed by an etch that selectively removes an oxide surface region that forms during the thermal oxidation process.

A first functional gate structure (26, 28) is then provided. By "functional gate structure" it is meant a permanent gate structure used to control output current (i.e., flow of carriers in the channel) of a semiconducting device through electrical or magnetic fields. The first functional gate structure that is formed includes a first gate material stack of, from bottom to top, a first gate dielectric portion 26 and a first gate conductor portion 28. An optional first gate cap portion (not shown) may be present atop the first gate conductor portion 28. In accordance with the present application, a topmost surface of the first functional gate structure is coplanar with a topmost surface of the ILD material 20. Although a single first functional gate structure is described and illustrated, a plurality of a first functional gate structures can be formed. Each first functional gate structure that is formed straddles each first semiconductor material fin portion 10F (or each first semiconductor material fin 10P). By "straddles", it is meant that one part of the first functional gate structure is located on one side of each first semiconductor material fin portion 10F (or each first semiconductor material fin 10P), and another part of the first functional gate structure is located on another side of each first semiconductor material fin portion 10F (or each first semiconductor material fin 10P).

The first gate dielectric portion 26 comprises a gate dielectric material. The gate dielectric material that provides the first gate dielectric portion 26 can be an oxide, nitride, and/or oxynitride. In one example, the gate dielectric material that provides the first gate dielectric portion 26 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the first gate dielectric portion 26.

The gate dielectric material used in providing the first gate dielectric portion 26 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the first gate dielectric portion 26 can have a thickness in a range from 1 nm to 10 nm. Other thicknesses that are lesser than, or greater than, the aforementioned thickness range can also be employed for the gate dielectric material.

The first gate conductor portion 28 comprises a gate conductor material. The gate conductor material used in providing the first gate conductor portion 28 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, first gate conductor portion 28 may comprise an nFET gate metal. In other embodiments, first gate conductor portion 28 may comprise a pFET gate metal.

The gate conductor material used in providing the first gate conductor portion 28 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the first gate conductor portion 28 has a thickness from 1 nm to 100 nm. Other thicknesses that are lesser than, or greater than, the aforementioned thickness range can also be employed for the gate conductor material used in providing the first gate conductor portion 28.

If present, the first gate cap portion comprises a gate cap material. The gate cap material that provides the first gate cap portion may include one of the dielectric materials mentioned above for hard mask material. In one embodiment, the first gate cap portion comprises silicon dioxide, silicon nitride, and/or silicon oxynitride. The dielectric material that provides the first gate cap portion can be formed utilizing a conventional deposition process such as, for example, chemical vapor deposition or plasma enhanced chemical vapor deposition. The dielectric material that provides the first gate cap portion can have a thickness from 5 nm to 20 nm. Other thicknesses that are lesser than, or greater than, the aforementioned thickness range can also be employed as the thickness of the dielectric material that provides the first gate cap portion.

The first functional gate structure can be formed by providing a first functional gate material stack of, from bottom to top, the gate dielectric material, the gate conductor material and, if present, the gate cap material. The first functional gate material stack can then be patterned. In one embodiment of the present application, patterning of the first functional gate material stack may be performed utilizing lithography and etching.

After forming the first functional gate structure (26, 28), block mask 22 can be removed from atop the second device region 102 utilizing any well known material removal process including, but not limited to, planarization, etching and/or ashing.

Figure 8:
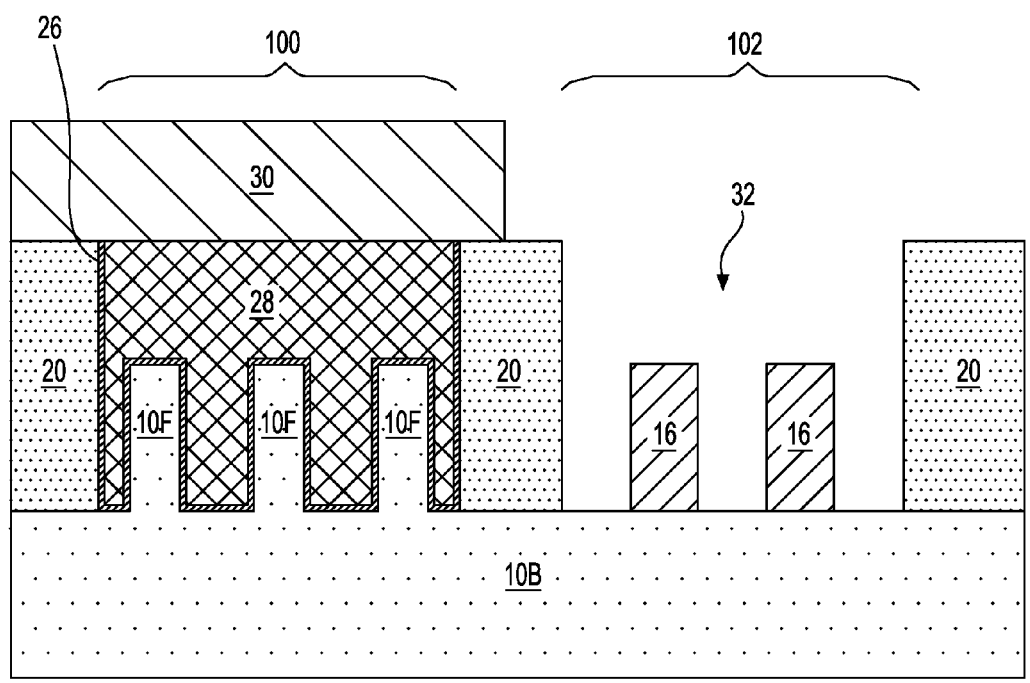
FIG. 8 is a cross sectional view of the exemplary semiconductor structure of FIG. 7 after forming another block mask over the first device region, and removing the sacrificial structure and each first semiconductor material fin from the second device region.

Referring now to FIG. 8, there is illustrated the exemplary semiconductor structure of FIG. 7 forming another block mask 30 over the first device region 100, and removing the sacrificial structure 18R and each first semiconductor material fin 10P from the second device region 102.

Block mask 30 comprises one of the block mask materials mentioned above for block mask 22. Block mask 30 can be formed utilizing one of the techniques mentioned above in forming block mask 22. Block mask 30 may also have a thickness within the range mentioned above for block mask 22. Sacrificial structure 18R can be removed from the second device region 102 utilizing an etch as described above in removing sacrificial structure 18L from the first device region 100.

Each first semiconductor material fin 10P is removed utilizing an etching process that is selective in removing the first semiconductor material that provides each first semiconductor material fin 10P relative to the semiconductor material that provides each second semiconductor material fin 16. In one example, and when each second semiconductor material fin 16 comprises a silicon germanium alloy, and each first semiconductor material fin 10P comprises silicon, tetramethylammonium hydroxide (TMAH) can be used to selectively remove each first semiconductor material fin 10P from the second device region 102. Second gate cavity 32 is formed after performing the above mentioned steps.

Figure 9:
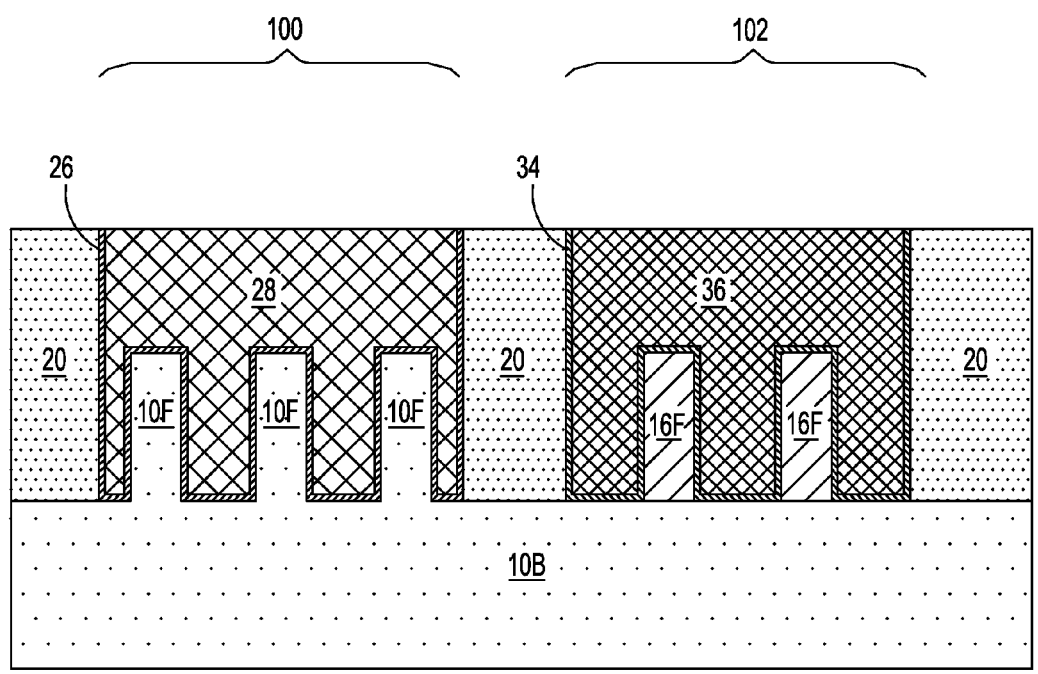
FIG. 9 is a cross sectional view of the exemplary semiconductor structure of FIG. 8 after thinning each of the second semiconductor material fins within the second device region, forming a second functional gate structure straddling each thinned second semiconductor material fin, and removing the another block from the first device region.

Referring now to FIG. 9, there is illustrated the exemplary semiconductor structure of FIG. 8 after thinning each of the second semiconductor material fins 16 within the second device region 102 not including block mask 30, forming a second functional gate structure (34, 36) straddling each thinned second semiconductor material fin, and removing the another block 30 from the first device region 100. The second functional gate structure (34, 36) is formed within the second gate cavity 32 mentioned above.

The thinned second semiconductor material fins 16 that can be formed have a width that is less than the width of each second semiconductor material fin 16 within the second device region 102 prior to performing the thinning. In some embodiments, the thinning of the second semiconductor material fins 16 within the second device region 102 can be omitted and the second semiconductor material fins 16 shown in FIG. 8 can be processed to include a second functional gate structure. Each thinned second semiconductor material fin within the second device region 102 that can be optionally formed can be referred to herein as second semiconductor material fin portion 16F.

In one embodiment of the present application, thinning of the second semiconductor material fin 16 within the second device region 102 may include thermal oxidation followed by an etch that selectively removes an oxide surface region that forms during the thermal oxidation process.

A second functional gate structure (34, 36) is then provided. The second functional gate structure that is formed includes a gate material stack of, from bottom to top, a second gate dielectric portion 34 and a second gate conductor portion 36. An optional second gate cap portion (not shown) may be present atop the second gate conductor portion 36. In accordance with the present application, a topmost surface of the second functional gate structure (34, 36) is coplanar with a topmost surface of the ILD material 20 as well as the topmost surface of the first functional gate structure (26, 28).

Although a single second functional gate structure is described and illustrated, a plurality of second functional gate structures can be formed. Each second functional gate structure that is formed straddles each second semiconductor material fin portion 16F (or each second semiconductor material fin 16). By "straddles", it is meant that one part of the first functional gate structure is located on one side of each second semiconductor material fin portion 16F (or each second semiconductor material fin 16), and another part of the second functional gate structure is located on another side of each second semiconductor material fin portion 16F (or each second semiconductor material fin 16).

The second functional gate structure (34, 36) can be formed utilizing the technique mentioned above for forming the first functional gate structure (26, 28). The second gate dielectric portion 34 includes one of the gate dielectric materials mentioned above for the first gate dielectric portion 26. In one embodiment, the second gate dielectric portion 34 may comprise a same gate dielectric material as the first gate dielectric portion 26. In another embodiment, the second gate dielectric portion 34 may comprise a gate dielectric material that differs from the gate dielectric material that provides the first gate dielectric portion 26. The gate dielectric material that provides the second gate dielectric portion 34 can be formed one of the deposition processes mentioned above for forming the gate dielectric material of the first gate dielectric portion 26. The thickness of the gate dielectric material that provides the second gate dielectric portion 34 is within the thickness range mentioned above for the gate dielectric material of the first gate dielectric portion 26.

The second gate conductor portion 36 includes one of the gate conductor materials mentioned above for the first gate conductor portion 28. In one embodiment, the second gate conductor portion 36 may comprise a same gate conductor material as the first gate conductor portion 28. In another embodiment, the second gate conductor portion 36 may comprise a gate conductor material that differs from the gate conductor material that provides the first gate conductor portion 26. The gate conductor material that provides the second gate conductor portion 36 can be formed one of the deposition processes mentioned above for forming the gate conductor material of the first gate conductor portion 28. The thickness of the gate conductor material that provides the second gate conductor portion 36 is within the thickness range mentioned above for the gate conductor material of the first gate conductor portion 28. In one embodiment of the present application, the first gate conductor portion 28 comprises a n-type metal, while the second gate conductor portion 36 comprises an n-type metal.

After forming the second functional gate structure (34, 36), block mask 30 can be removed from atop the second device region 100 utilizing any well known material removal process including, but not limited to, planarization, etching and/or ashing.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A method of forming a semiconductor structure, said method comprising:

providing a plurality of spaced apart first semiconductor material fins in a first device region and a second device, wherein each first semiconductor material fin comprises a first semiconductor material and extends upward from a substrate;

forming a second semiconductor material fin in a gap located between each first semiconductor material fin within said first device region and within said second device region, wherein each second semiconductor material fin comprises a second semiconductor material having a lattice constant that differs from the first semiconductor material;

forming a first sacrificial structure over said first device region and a second sacrificial structure over said second device region;

selectively removing said first sacrificial structure and each second semiconductor material fin from said first device region to provide a first gate cavity;

forming a first functional gate structure in said first gate cavity and straddling each first semiconductor material fin;

selectively removing said second sacrificial structure and each first semiconductor material fin from said second device region to provide a second gate cavity; and forming a second functional gate structure in said second gate cavity and straddling each second semiconductor material fin.

2. The method of claim 1, wherein said providing said plurality of spaced apart first semiconductor fins comprises:
  providing a semiconductor substrate comprising at least said first semiconductor material;
  forming a hard mask layer on a surface of said first semiconductor material; and
  patterning said hard mask layer and at least an uppermost portion of said first semiconductor material.

3. The method of claim 2, wherein a portion of said hard mask layer remains on a topmost surface of each first semiconductor material fin, and each remaining portion of said hard mask layer is removed prior to forming said first and second sacrificial structures.

4. The method of claim 1, wherein a width of each first semiconductor material fin is equal to half a desired fin pitch.

5. The method of claim 1, wherein said forming said second semiconductor material fin comprises an epitaxial growth process.

6. The method of claim 1, wherein said lattice constant of said second semiconductor material is within 1 percent of said lattice constant of said first semiconductor material.

7. The method of claim 6, wherein said first semiconductor material is silicon, and said second semiconductor material is a silicon germanium alloy.

8. The method of claim 1, further comprising forming an interlevel dielectric material on exposed surfaces of said substrate and surrounding said first device region and said second device region, wherein said forming said interlevel dielectric material is performed after said forming said first and second sacrificial structures, and prior to said selectively removing said first sacrificial structure.

9. The method of claim 1, wherein a height of each first semiconductor material fin is equal to a height of each second semiconductor material fin and wherein a width of each second semiconductor material fin is substantially equal to a width of each first semiconductor material fin.

10. The method of claim 1, further comprising thinning each first semiconductor material fin within the first device region after said removing said first sacrificial structure and each second semiconductor material fin from said first device region and prior to said forming said first functional gate structure.

11. The method of claim 10, wherein said thinning comprises oxidation and etching.

12. The method of claim 1, further comprising thinning each second semiconductor material fin within the second device region after said removing said second sacrificial structure and each first semiconductor material fin from said second device region and prior to said forming said second functional gate structure.

13. The method of claim 12, wherein said thinning comprises oxidation and etching.

14. A method of forming a semiconductor structure, said method comprising:
  providing a plurality of spaced apart first semiconductor material fins in a first device region and a second device, wherein each first semiconductor material fin comprises a first semiconductor material and extends upward from a substrate;
  forming a second semiconductor material fin in a gap located between each first semiconductor material fin within said first device region and within said second device region, wherein each second semiconductor material fin comprises a second semiconductor material having a lattice constant that differs from the first semiconductor material;
  forming a first sacrificial structure over said first device region and a second sacrificial structure over said second device region;
  selectively removing said second sacrificial structure and each first semiconductor material fin from said second device region to provide a second gate cavity;
  forming a second functional gate structure in said second gate cavity and straddling each second semiconductor material fin;
  selectively removing said first sacrificial structure and each second semiconductor material fin from said first device region to provide a first gate cavity; and
  forming a first functional gate structure in said first gate cavity and straddling each first semiconductor material fin.

15. The method of claim 14, wherein a width of each first semiconductor material fin is equal to half a desired fin pitch.

16. The method of claim 14, wherein said lattice constant of said second semiconductor material is within 1 percent of said lattice constant of said first semiconductor material.

17. The method of claim 14, wherein a height of each first semiconductor material fin is equal to a height of each second semiconductor material fin and wherein a width of each second semiconductor material fin is substantially equal to a width of each first semiconductor material fin.

18. The method of claim 14, further comprising forming an interlevel dielectric material on exposed surfaces of said substrate and surrounding said first device region and said second device region, wherein said forming said interlevel dielectric material is performed after said forming said first and second sacrificial structures, and prior to said selectively removing said second sacrificial structure.

19. The method of claim 14, further comprising thinning each second semiconductor material fin within the second device region after said removing said second sacrificial structure and each first semiconductor material fin from said second device region and prior to said forming said second functional gate structure.

20. The method of claim 14, further comprising thinning each first semiconductor material fin within the first device region after said removing said first sacrificial structure and each second semiconductor material fin from said first device region and prior to said forming said first functional gate structure.

\* \* \* \* \*